US012200089B2

(12) United States Patent
Fisher et al.

(10) Patent No.: US 12,200,089 B2
(45) Date of Patent: Jan. 14, 2025

(54) BI-DIRECTIONAL BUFFER WITH CIRCUIT PROTECTION TIME SYNCHRONIZATION

(71) Applicant: Intel Corporation, Santa Clara, CA (US)

(72) Inventors: April E. Fisher, Hillsboro, OR (US); Benjamin Cheong, Tigard, OR (US); Kevin Bross, Tigard, OR (US); Manishkumar T. Rana, Hillsboro, OR (US); Andrew M. Monk, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 1048 days.

(21) Appl. No.: 16/783,077

(22) Filed: Feb. 5, 2020

(65) Prior Publication Data

US 2020/0266967 A1 Aug. 20, 2020

(51) Int. Cl.
*H04L 7/00* (2006.01)

(52) U.S. Cl.
CPC .......... *H04L 7/0012* (2013.01); *H04L 7/0091* (2013.01)

(58) Field of Classification Search
CPC ............................ H04L 7/0012; H04L 7/0091
USPC .......................................................... 370/503
See application file for complete search history.

(56) References Cited

U.S. PATENT DOCUMENTS

| | | | | |
|---|---|---|---|---|
| 2009/0027243 | A1* | 1/2009 | Leung | H01L 23/48 341/100 |
| 2011/0196627 | A1* | 8/2011 | Steinhauser | H04L 43/08 702/58 |
| 2013/0121352 | A1 | 5/2013 | Shen et al. | |
| 2015/0331819 | A1* | 11/2015 | Iwasaki | G06F 1/3296 710/110 |
| 2016/0182217 | A1* | 6/2016 | Hashizume | H04B 17/364 375/354 |
| 2017/0054306 | A1* | 2/2017 | Vo | H02J 7/0016 |
| 2018/0092177 | A1* | 3/2018 | Powers | G01N 21/6408 |

OTHER PUBLICATIONS

Microsemi Corporation, "IEEE 1588 Precision Time Protocol (PTP): A Two-Way Communication Protocol", Microchip, Microsemi Product Portfolio, https://www.microsemi.com/blog/2018/06/06/IEEE-1588-precision-time-protocol-ptp-a-two-way-communication-protocol/, Jun. 6, 2018, 3 pages.

Texas Instruments Incorporated, "AN-1728 IEEE 1588 Precision Time Protocol Time Synchronization Performance", Application Report, SNLA098A—Oct. 2007—Revised Apr. 2013, 10 pages.

(Continued)

*Primary Examiner* — Christopher M Crutchfield
*Assistant Examiner* — Jean F Voltaire
(74) *Attorney, Agent, or Firm* — Compass IP Law PC

(57) ABSTRACT

Examples described herein are used in timing synchronization systems. A timing synchronization system provides circuits that support bi-directional half-duplex voltage signals (transmit or receive) but protect against incorrect input/output configuration whereby a transmit signal media is connected to a receive port or a receive signal media is connected to a transmit port. The system provides configurable signal propagation by use of parallel connection of two or more buffer in series with a resistor. Various isolation circuitry and resistors can be used to protect against signal transmission during receive mode.

14 Claims, 10 Drawing Sheets

SFP Port 102-0
PHY 104-0
PHY 106-0
MAC 108
SFP Port 102-1
PHY 104-1
PHY 106-1
SDPs
SDPs
SMA 120-0
Timing signal interface 122-0
SMA 120-1
Timing signal interface 122-1

(56) References Cited

OTHER PUBLICATIONS

International Search Report and Written Opinion for PCT Patent Application No. PCT/US20/65436, Mailed Apr. 1, 2021, 12 pages.

Extended European Search Report for Patent Application No. 20917721.1, Mailed Jan. 29, 2024, 7 pages.

* cited by examiner

BI-DIRECTIONAL BUFFER WITH CIRCUIT PROTECTION TIME SYNCHRONIZATION

Time synchronization involves synchronizing clocks such as those using time stamps between different devices. For example, IEEE 1588-2008 Precision Time Protocol (PTP) synchronizes time between different nodes on an Ethernet network. The IEEE 1588-2008 protocol depends on exchange of time-stamped frames between a device that uses a timing master clock and another device that uses a timing receiver clock. The IEEE 1588 standards describe a hierarchical primary-secondary architecture for clock distribution. Under this architecture, a time distribution system consists of one or more communication media (network segments), and one or more clocks. An ordinary clock is a device with a single network connection and is either the source of (primary or master) or destination for (secondary or slave) a synchronization reference. A boundary clock has multiple network connections and can accurately synchronize one network segment to another. A synchronization master is selected for each of the network segments in the system. The root timing reference is called the grandmaster. The grandmaster transmits synchronization information to the clocks residing on its network segment. The boundary clocks with a presence on that segment then relay accurate time to the other segments to which they are also connected.

A simplified PTP system frequently consists of ordinary clocks connected to a single network, and no boundary clocks are used. A grandmaster is elected and all other clocks synchronize directly to it. IEEE 1588-2008 introduces a clock associated with network equipment used to convey PTP messages. The transparent clock modifies PTP messages as they pass through the device. Timestamps in the messages are corrected for time spent traversing the network equipment.

As technologies require faster and more reliable communications, time synchronization becomes more critical. Industries such as telecommunications, financial trading, and power plants rely on the ability to quickly ensure that events all happen at the right time through rapid and precise timestamping. With emerging technologies such as 5G, interest in enhanced timing is ever-increasing.

DETAILED DESCRIPTION

Figure 1:
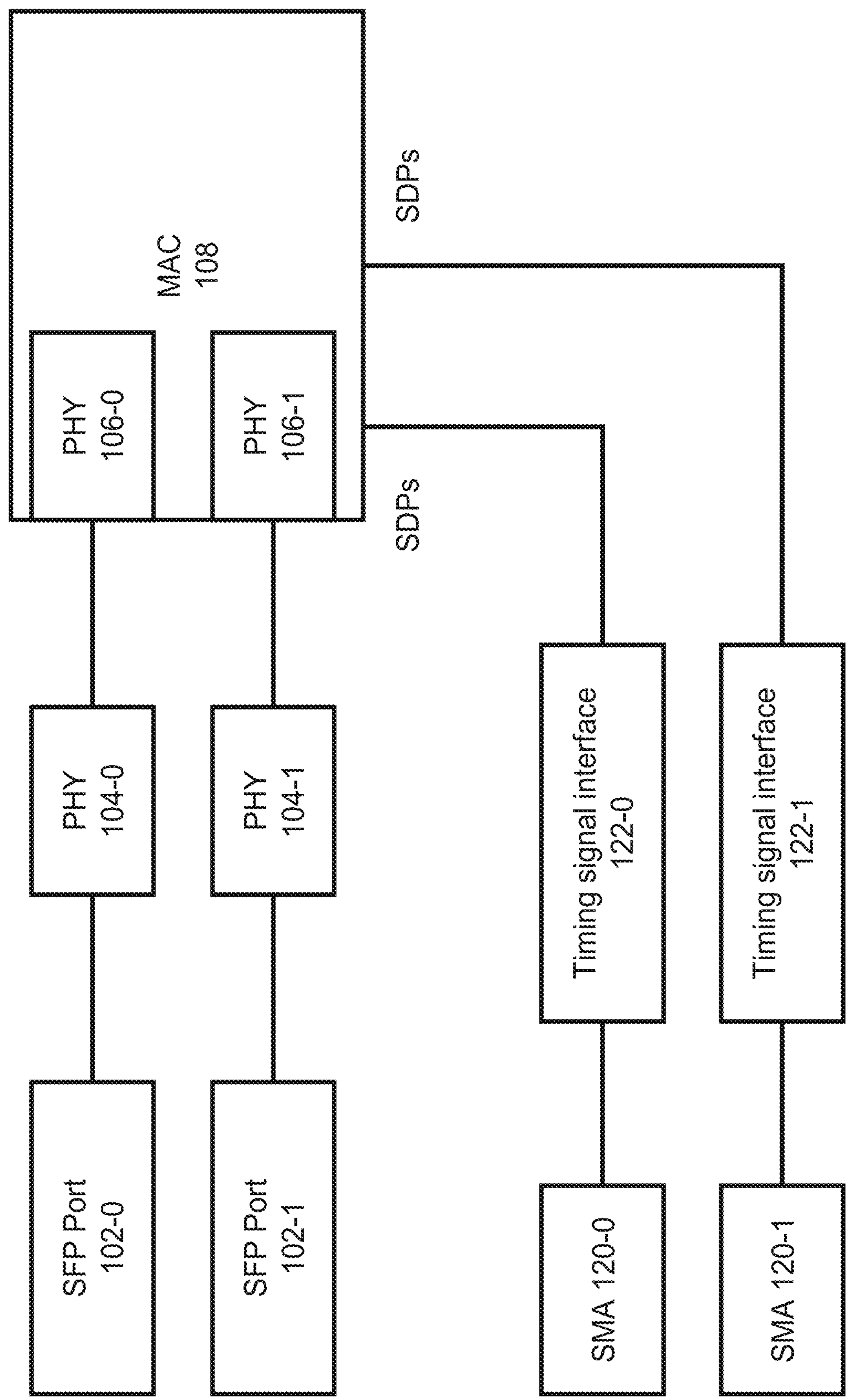
FIG. 1 depicts an example system.

As central processing units (CPUs), chipsets, field-programmable gate array (FPGA) devices, application-specific integrated circuits (ASICs) and other input/output (I/O) devices migrate to use of lower voltage levels to reduce device power consumption, the need for voltage level shifting of voltage signals to and from input/output (I/O) pins becomes a necessity. In addition, for I/O devices, bidirectional signaling, whereby transmitted and received signals are carried using the same circuit, is advantageous because it reduces pin count and reduces front I/O plate circuit board space used for I/O. Bidirectional signaling also permits user flexibility for using the I/O circuit to transfer transmitted or received signals.

Some discrete bidirectional voltage level shifters lack the ability to provide the high amounts of current necessary to drive long capacitive cables while maintaining fast signal rise times. Some time-synchronization devices do not have circuit protection from bus contention when connected incorrectly as an input and output by the user whereby signals are driven in and out (receive and transmit) simultaneously and can cause permanent damage to the device.

Some level shifters exhibit longer propagation delays, which is detrimental to precision phase alignment needed in certain applications, such as IEEE 1588 synchronization for 5G networks or other systems that require single-digit nanosecond time synchronization precision. Some level shifters support specific voltages rather than a range of voltages.

Some time-synchronization devices require a user to power down the system and have physical access to the device to manually configure the jumpers connected to the media for transmit or receive, which interrupts use of the network device, increases network down-time, and can disrupt network bandwidth. Moreover, jumpers can be easily misconfigured by the user, resulting in permanent physical damage to equipment and potential harm to the user.

Various embodiments provide circuits that support simultaneous bidirectional voltage signals (transmit and receive) but protect against incorrect input/output configuration (e.g., due to user error whereby a transmit signal media is connected to a receive port or a receive signal media is connected to a transmit port) while providing a fast rise-time (e.g., single-digit nanoseconds) for signal propagation used for time synchronization. For example, if a cable is plugged into the wrong port, a signal can be received by the time-synchronization device from a port that is to transmit signals. Generally, protection that uses high resistances in a signal path against incorrect configuration and excessive current level will degrade the rise-time of a signal due to a higher resistor-capacitance (RC) time constant. Various embodiments manage rise-time of a signal and corresponding propagation delays by splitting the transmit circuits into multiple parallel signal paths to reduce the effective RC time constant. Various embodiments can permit use of a range of user-connected cables (e.g., types and lengths) with various exhibited capacitance values and control RC time constant to achieve desired signal propagation delay by controlling propagation delay by tuning the resistance and capacitance levels of multiple parallel signal paths.

Various embodiments permit software-based transmit or receive configuration of a time-synchronization device and do not require a user to manually change transmit or receive cables attached to the time-synchronization device.

Various embodiments support a voltage shift of a wide range of input signal voltage amplitudes (e.g., 1.65V to 5.5V or other ranges) by software-based control and without requiring manual configuration for the voltage shift.

Accordingly, various embodiments can be used with a network interface or systems that require high precision receipt or transmission of time-stamped signals, such as time-stamped signals compatible with IEEE 1588 (2008). For example, time-stamped signal can include Sync, Delay- _Req, Pdelay_Req, and Pdelay_Resp messages of IEEE 1588 (2008) and IEEE 802.1AS (2011).

FIG. 1 depicts an example system that includes a network interface and time-synchronization circuitry. An example system can include a circuit board with Ethernet compatible signal generation and processing circuits and time-synchronization circuitry. Small form-factor pluggable (SFP) compatible port support synchronous optical networking (SONET), Gigabit Ethernet, Fibre Channel, Passive Optical Network (PON), and other communications standards. In this example, two SFP28 compatible ports 102-0 and 102-1 are used but any number or types of ports can be used. Physical layer interfaces (PHY) 104-0 and 104-1 can format or reconstruct signals according to applicable physical layer specifications or standards. In this example, an Ethernet media access controller (MAC) 108 can be used to perform media access control encoding or decoding in accordance with applicable standards. Not shown are other layers of packet processing of received or transmittable packets using a network interface or host device.

Concerning timing synchronization, one or more SubMiniature version A (SMA) cable connectors 120-0 and 120-1 with bidirectional capability can be used to transmit or receive timing related signals. SMA connectors 120-0 and 120-1 allow for bi-directional transmit and receive configurations with less front panel and printed circuit board (PCB) area consumed than if transmit-only and receive-only paths were utilized. An SMA or other timing connector can be adjacent to an SFP or Ethernet port. SMA connectors 120-0 and 120-1 can be used to transfer or receive PTP or other time synchronization related signals. An I/O plate can be labeled indicating the SMA connector can support bidirectional signals. A front I/O plate can be labeled to indicate that the timing SMA connector provides support for multiple voltage signal amplitudes.

In some examples, SMA connectors 120-0 and 120-1 support input or output of continuous square-wave signals at 1 pulse per second (PPS) in reference to the ITU-T G.703 Standard. According to some standards, such as ITU-T G.703, 1 PPS pulse rise/fall times must be less than 5 nanoseconds (ns). As implemented in various embodiments, a transmitted 1 PPS square-wave pulses between 0V and ~5V whereas a received 1 PPS square-wave may pulse between 0V and ranging from 1.65V to 5.5V.

Timing signal interfaces 122-0 and 122-1 with transmit and receive capability can transfer received or transmittable timing related signals. Some bidirectional level shifters require dual voltage levels VCCA and VCCB, which would require the user to set the desired input voltage manually. Additionally, some bidirectional level shifters require VCCA to be lower than VCCB, so providing a 3.3V output while trying to support an input voltage both lower and higher than the needed I/O voltage could be problematic. Various embodiments split the transmit and receive paths and to use a Software Defined Pin (SDP) to set the desired direction of the signal ensuring that either transmit or receive path is active at a time. The transmit path utilizes multiple buffers, power resistors, and isolation switches placed in parallel to lower series resistance and enable faster signal rise times. This topology protects against damage due to a signal being driven simultaneously from both the on-board device and an external link partner. The receive path also has protection from inadvertent transmission using termination resistors and isolation switches.

According to some examples, timing signal interfaces 122-0 and 122-1 or MAC 108 can apply IEEE 1588 compatible time synchronization. Timing signal interfaces 122-0 and 122-1 can support input or output continuous square-wave signal at 1 PPS on the same pins for half-duplex operation. A transmitted or received 1 PPS square-wave must pulse between 0V and 3.3V and source/sink current is limited to 12 mA maximum. However, these parameters are non-limiting and any voltage levels, duplex mode, or current can be used.

As an implementation of some embodiments, a circuit board can be used with timing circuitry and Ethernet communications circuitry. Various SMA ports can be placed next to Ethernet ports. SMA ports can transmit or receive timing related signals in accordance with embodiments described herein. A symmetrical layout of timing synchronization circuit blocks connecting to SMA ports with multiple identical buffer components in parallel and trace length matching can be used. User configurable hardware components (e.g., jumpers, manual switches) may not be utilized.

Figure 2:
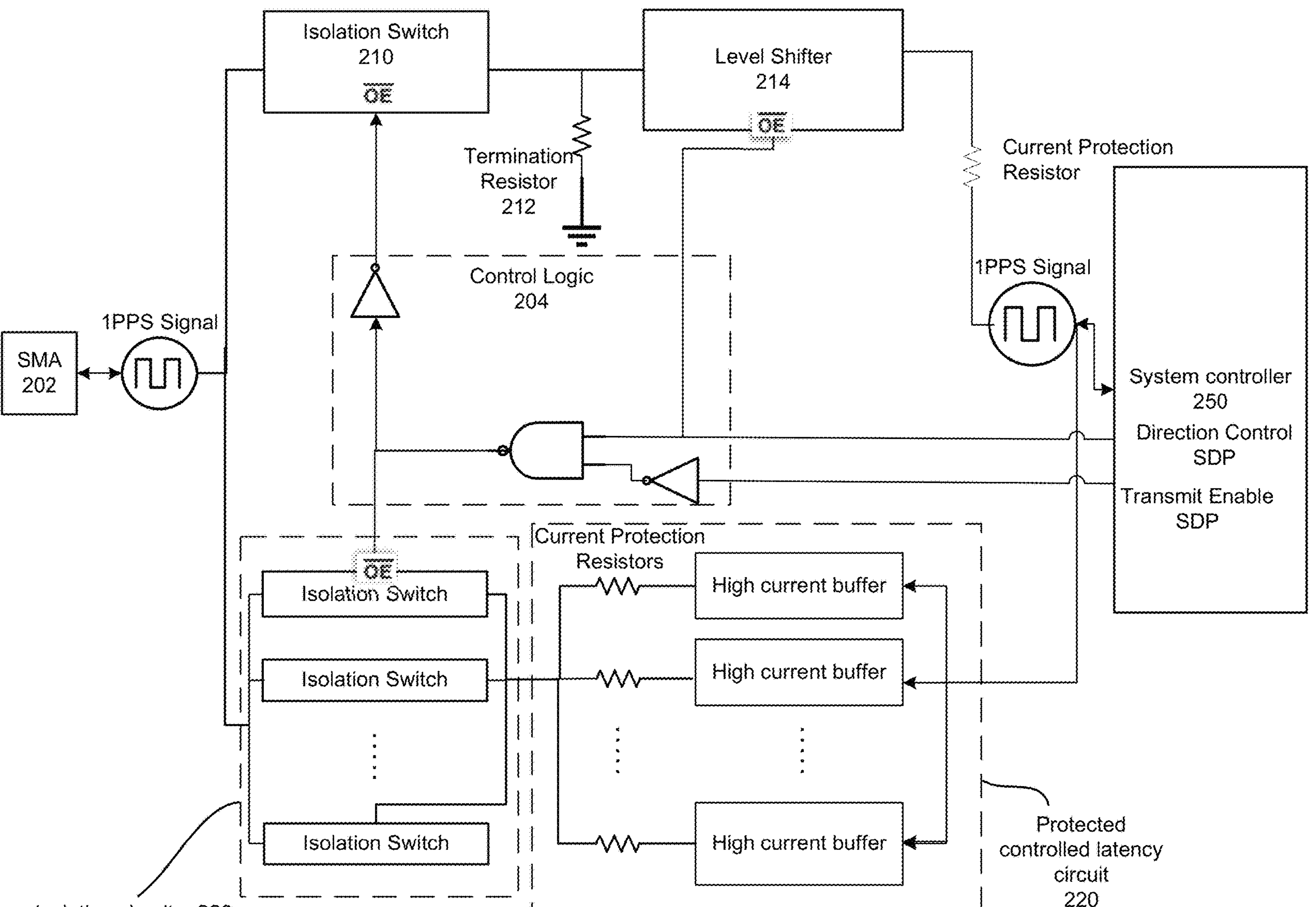
FIG. 2 depicts an example system.

FIG. 2 depicts an example time synchronization system. The system can receive signals via an SMA port 202 and/or transmit a signal to an SMA port 202. Control logic 204 enables either receive or transmit paths, while preventing both transmit and receive paths from being enabled simultaneously. An SDP provided by system controller 250 can be a form of General Purpose Input/Output (GPIO) signal that is used to configure control logic 204 to enable a receive or transmit path. Example descriptions of receive and transmit paths are provided with respect to respective FIGS. 3A and 3B. Various embodiments provide for receipt of a signal from an SMA port 202 that permits multi-voltage level shifting using level shifter 214 and a ~50 ohm termination resistor 212 without interfering with a transmission path. Various embodiments provide for transmission of a signal to an SMA port 202 with circuit protection from misconfiguration and bus contention due to receipt of a signal during a transmission interval. Various embodiments provide a protected controlled latency circuit with configurable propagation delay and rise time of the time synchronization signal even in the case of additional load capacitance (e.g., from PCB traces, board components, or connected cables (e.g., twisted pair)).

Figure 3A:
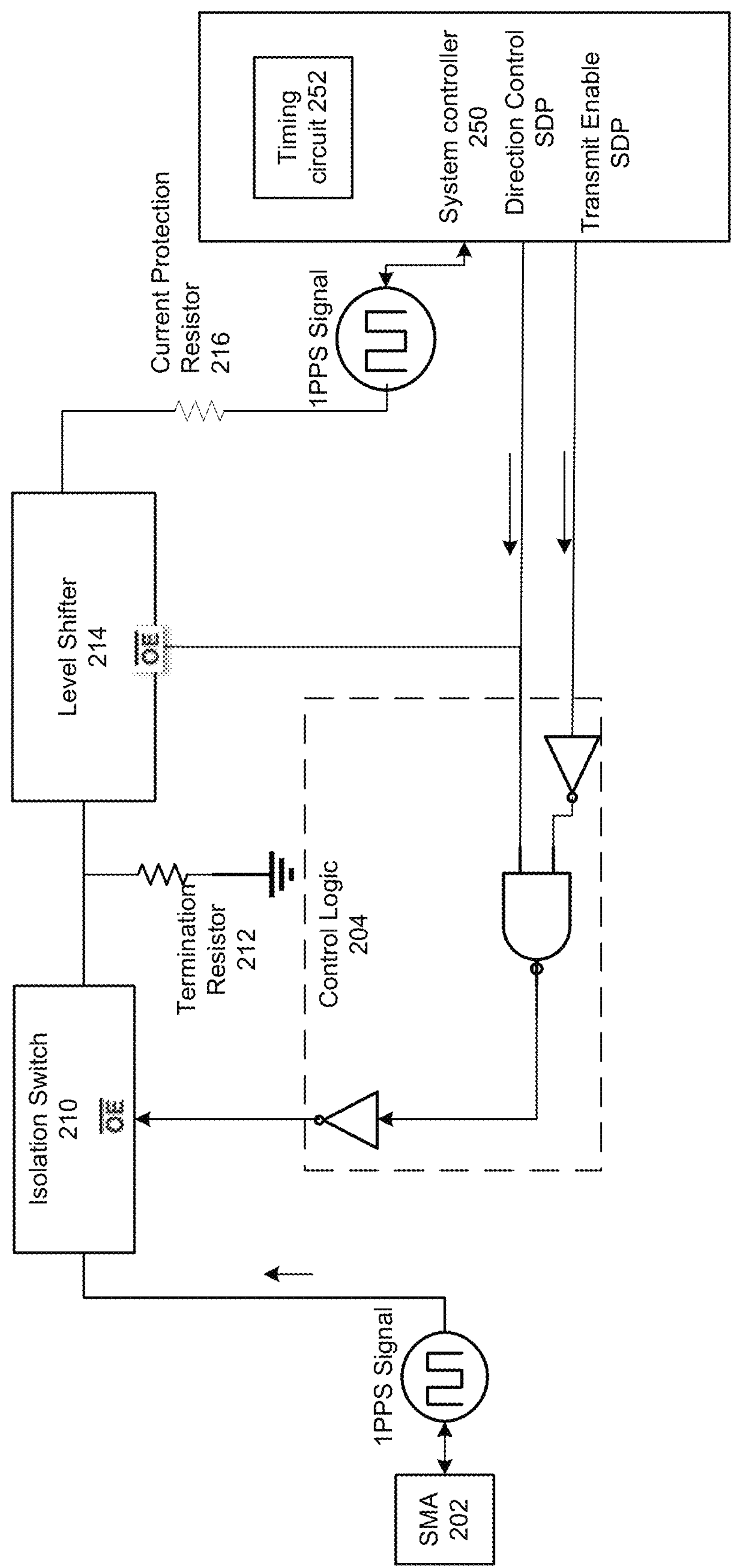
FIG. 3A depicts an example of a receive portion of the system.

FIG. 3A depicts an example of a receive portion of the system. Various embodiments include an isolation switch 210 between SMA input 202 and termination resistor 212. Isolation switch 210 can be implemented as a FET bus switch. Termination resistor 212 at the input of level shifter 214 is used to avoid transmission line reflections and can be approximately a ~50 ohm pull-down resistor. Note any current regulating circuitry or resistor can be implemented as resistor devices, one or more metal-oxide-semiconductor field-effect (MOSFET) or FET transistors, or other logic. Termination resistor 212 is not in a signal path during transmission from SMA port 202 because during signal transmission (described later), level shifter 214 is isolated and disconnected from the transmit path.

For the various embodiments of the receive path, a unidirectional level shifter 214 provides multi-voltage level shifting without customer intervention. A unidirectional level shifter 214 can provide the capability to receive 1.65V-5.5V and transmit at a specific VCC voltage. Example implementations of level shifter 214 include Texas Instruments SN74LV1T125 or Nexperia 74LV1T125. Level shifter 214 can support a wide input range including 5.5V and a 3.3V output with a single VCC source and can be isolated when off and disabled (e.g., an open circuit) to provide protection against circuit damage from received current. Level shifter 214 can support a current above the system controller 250 maximum rated current (e.g., 12 mA or some other value) and provide low propagation delay, low rise time and low capacitance. Other voltage shift ranges can be used. In addition, level shifter 214 is able to provide isolation during a transmission disabled state against transmitted signals during a receive state. In order to protect against the event of signal transmitting and receiving at the same time, a series resistor 216 is provided between level shifter 214 and system controller 250. Current protection resistor 216 protects from level shifter 214 driving an output to controller 250 high while controller 250 drives an input to level shifter 214 low, which is an error situation of output signal to level shifter through a path of current protection resistor 216. Although the rise time will be impacted by series resistor 216, the rise time delay can be consistent and therefore characterized and taken into account and accommodated for to determine accurate time stamp receipt times. For example, a consistent rise time can be used by clock-disciplining driver software (e.g., driver to control PTP hardware clock counter) to adjust time stamp receipt time by reducing the time stamp receipt time by the rise time. In another example, an output voltage from a digital-to-analog converter (DAC) can be adjusted to adjust a frequency of a crystal oscillator to reduce the time stamp receipt time by the rise time.

For example, current protection resistor 216 can be implemented as a 274 ohm resistor (or other value) but because there is a consistent rise time, controller 250 can account for a consistent signal delay and accommodate for the delay. For example, for a 10 ns delay, the time stamp can be back dated by 10 ns.

An example of signal receipt processing is as follows. Direction Control SDP dynamically configures control logic 204 to cause the device to operate in signal receipt mode. For example, a user can configure system controller 250 to enable a receive path. System controller 250 provides output enable (OE) with receive path enabled. Isolation switch 210 and level shifter 214 are enabled. When isolation switch 210 is enabled, signals from level shifter 214 are transferred through termination resistor 212 as isolation switch 210 is an open circuit to signals received from level shifter 214.

A signal received at SMA port 202 is transferred to isolation switch 210. For example, SMA port 202 can provide a clock pulse of 1 pulse/second to indicate a start of one or more seconds. Enabled isolation switch 210 transfers the clock pulse to level shifter 214. Level shifter 214 shifts an amplitude range of received signals to a voltage range accepted by system controller 250. For example, if an input voltage range is 1.65V to 5.5V, then a 0V to 3.3V range is provided to system controller 250. Any voltage ranges can be used with a low end, for example, of any of 1.1V, 1.3V, 1.5V, 1.65V, 1.8V, 2.0V, 2.1V, 2.5V, 3.0V, or 3.3V and a higher end of any of 1.5V, 1.8V, 2.0V, 2.4V, 2.65V, 3.0V, 3.3V, 3.6V, 5.0V, 5.5V, 6.0V, 6.5V, or 7.0V. Any voltage ranges or current levels can be supported.

System controller 250 processes the received signal. System controller 250 aligns timing circuit 252 (e.g., digital control circuit or phase lock loop (PLL)) with the one pulse/second signal carried in the received signal. For example, a Global Positioning System (GPS) signal can provide one pulse/second signal. Timing circuit 252 can communicate boundaries of seconds to another device via clock pulse signals.

Figure 3B:
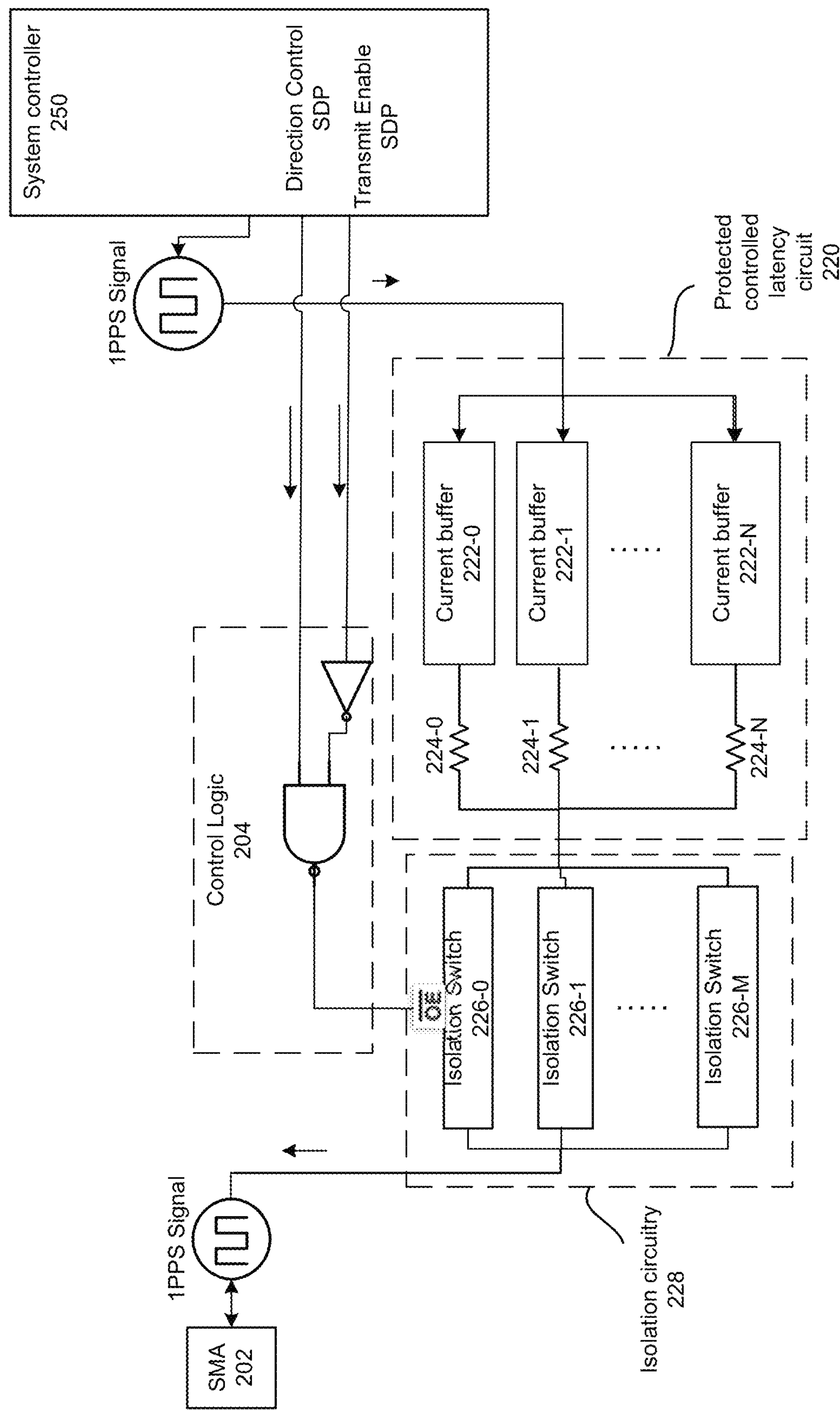
FIG. 3B depicts an example transmit circuit portion.

FIG. 3B depicts an example transmit circuit path portion. Various embodiments provide protection against circuit damage from excessive voltage or current placed in the transmit path of a signal but with configurable RC-time constant-related delay. Various scenarios are to be protected against, many of which could cause permanent damage to the device.

Buffer 222 can source transmitted signals and sink current received by mistaken current input. Protection series resistors 224-0 to 224-N can be used from an output from respective current buffers 222-0 to 222-N to an input of isolation circuitry 228. Protection series resistors 224-0 to 224-N can be used to absorb current and protects against high input current (e.g., 130 mA) received at protected controlled latency circuit 220 to protect the buffers 222-0 to 222-N from damage. Protection resistors 224-0 to 224-N are used to protect against current received at an output of respective buffers 222-0 to 222-N during transmit mode. A resistor 224 can refer to any or all of resistors 224-0 to 224-N. Buffer 222 can refer to any or all of buffers 222-0 to 222-N. In some examples, resistor 224 is approximately 40 ohms but any value can be used depending on the current level tolerated at an output of current buffer 222.

However, with unchanging capacitance level, increasing resistance of protection resistor 224 will increase an RC constant and potentially increase propagation time to an unacceptable level. Table 1 shows an example of a rise time for use of a 40 ohm protection resistor in series with a buffer. The buffer can source and sink current, but with a 40 ohm protection series resistor, too high of a rise time occurs as a rise time of 16.85562 ns is not within acceptable specifications.

TABLE 1

| 40 ohm rise time calculation | |
|---|---|
| Series Resistance (ohms) | 40 |
| Load Capacitance (pF) | 350 |
| Time Constant (ns) | 14 |
| Vsignal | 3.3 |
| % Rise Time | 0.7 |
| Voh | 2.31 |
| Rise Time to Voh (ns) | 16.85562 |

Various embodiments provide protected controlled latency circuit 220 or configurable RC time constant circuitry that includes a buffer 222-0 in series with protection resistor 224-0 in parallel with one or more other buffer in series with a protection resistor such as buffer 222-1 in series with resistor 224-1 in parallel with buffer 222-2 in series with resistor 224-2 and so forth. An effective RC constant contributed by protected controlled latency circuit 220 can be configured by a resistance level of a resistor 224-0 to 224-N or a number of parallel couplings of a buffer 222 in series with a protection resistor 224. Lowering the RC time constant can provide faster rise time for signals propagated through a buffer 222 in series with protection resistor 224 combination. In some examples, a buffer 222 can be implemented as an operational amplifier with high bandwidth (e.g., 1 GHz) with fast rise time (e.g., sub-nanosecond) and low propagation delay. An example operational amplifier is Analog Devices AD8000. In some examples, buffer 222 in series with a protection resistor 224 are matched for different legs so that any leg provides the same input impedance and each buffer 222 receives the same share of the input signal from system controller 250.

To isolate transmit path from the receive path (and vice versa), as well as to prevent damage to buffers 222, isolation circuitry 228 are placed at the output of protected controlled latency circuit 220. Isolation circuitry 228 can include one or more isolation switches 226-0 to 226-M. An isolation switch can be a low capacitance, low propagation delay, low resistance, 5.5V tolerant, high current, isolated when unpowered FET bus switch.

If isolation circuitry 228 does not have a low enough propagation delay that can also handle high enough current levels, some embodiments configure isolation switches 226-0 to 226-M in parallel by tying the inputs of a multiple isolation switches together and separately tying isolation switch outputs together in order to allow more current through the parallel combination of isolation switches. Splitting current across multiple isolation switches in parallel can be used to configure a contribution to the RC time constant and propagation delay of a transmitted signal.

An example transmit operation is as follows. Direction Control SDP and Transmit Enable SDP configures control logic 204 to cause the device to operate in signal transmit mode. For example, a user can configure system controller 250 to enable a transmit path. System controller 250 provides output enable (OE #) with transmit path enabled. System controller 250 outputs direction control SDP to go high and transmit enable SDP to go low. System controller 250 can provide an output signal such as second increment signal (e.g., 1PPS signal) to send to other devices for time synchronization. System controller 250 provides a signal to protected controlled latency circuit 220. Note that if transmit side propagation delay is known through protected controlled latency circuit 220 and isolation circuitry 228 to SMA 202 or even through a cable connecting SMA 202 to another device, then the propagation delay can be added to the time stamp so that the receiver can receive a more accurate time stamp.

Potential cases of damage to the time synchronization system are shown in Tables 2 and 3 and are highlighted. In Tables 2 and 3, voltage at SMA represents a voltage level at the SMA port 202 between the SMA port 202 and isolation circuitry 228. Voltage at controller SDP represents a voltage output from system controller 250 to protected controlled latency circuit 220. Current at OpAmp Output Resistor represents current through a current protection resistor 224. The voltages ranges provided herein are merely examples, and any ranges of voltages can be used.

For a valid configuration, scenario 2 represents an enabled receive path (Rx Path) and a voltage at the SMA port of 5.5V which causes the implementation of a device that can handle 5.5V and translate it to the 3.3V I/O voltage of the system controller 250. Use of the level shifter 214 protects the system controller 250.

For a misconfiguration, scenario 9, scenario 13, scenario 14, and scenario 15 represent scenarios where a transmit path is enabled, and a signal is transmitted but a signal is received at SMA 202 simultaneously. Current protection resistor 224 and the voltage isolation switch 210 can prevent damage to the time synchronization system by scenarios 9, 13, 14, and 15.

For a misconfiguration, scenario 11, scenario 16, scenario 22, and scenario 28 represent scenarios where a receive path is enabled, but a signal is transmitted from system controller 250 simultaneously. Current protection resistor 216 and voltage isolation circuitry 228 can prevent damage to the time synchronization system by scenarios 11, 16, 22, and 28.

For a misconfiguration, scenario 12 represents a scenario where the time synchronization system is unpowered but a signal is received at the SMA port. On the transmit path, isolation circuitry 228 and on the receive path, isolation switch 210 can prevent damage to the time synchronization system by scenario 12.

For a misconfiguration, scenario 17 represents a scenario where a receive path is enabled but there a voltage at the SMA port. This causes a device that can handle 5.5V and translate it to the 3.3V I/O voltage of the system controller 250, which is done with the level shifter 214.

TABLE 2

| | User Configurations | | | Results | | | |
|---|---|---|---|---|---|---|---|
| Scenario | Link Partner Setup | Controller Timing SDP Setup | Path Enabled via Control Logic SDPs | Voltage at SMA | Voltage at Controller SDP (must be <= 3.3 V) | Current at OpAmp Output Resistor | Current Sourced/Sinked by Controller (must be <= 12 mA) |
| | Valid Configurations | | | | | | |
| 1 | Output (LP Tx low = 0 V) | Input | Rx Path | 0 V | 0 V | 0 | 0 |
| 2 | Output (LP Tx high = 5.5 V) | Input | Rx Path | 5.5 V | 3.3 V | 0 | 0 |
| 3 | Input | Output (SDP Tx low = 0 V) | Tx Path | 0 V | 0 V | 0 | 0 |
| 4 | Input | Output (SDP Tx high = 3.3 V) | Tx Path | 5 V | 3.3 V | 0 | 0 |
| 5 | Off | Off | Off | 0 V | 0 V | 0 | 0 |

TABLE 3

| | User Configurations | | | Results | | | |
|---|---|---|---|---|---|---|---|
| | Link Partner Setup | Controller Timing SDP Setup | Path Enabled via Control Logic SDPs | Voltage at SMA | Voltage at Controller SDP (must be <3.3 V) | Current at OpAmp Output Resistor | Current Sourced/Sinked by Controller (must be <12 mA) |
| | Misconfigurations (e.g., user error, malicious attack) | | | | | | |
| 6 | Output (LP Tx low = 0 V) | Off | Off | 0 V | 0 V | 0 | 0 |
| 7 | Output (LP Tx low = 0 V) | Input | Tx Path | 0 V | 0 V | 0 | 0 |
| 8 | Output (LP Tx low = 0 V) | Output (SDP Tx low = 0 V) | Tx Path | 0 V | 0 V | 0 | 0 |
| 9 | Output (LP Tx low = 0 V) | Output (SDP Tx high = 3.3 V) | Tx Path | 0 V | 3.3 V | 3.3 V/R | 0 |
| 10 | Output (LP Tx low = 0 V) | Output (SDP Tx low = 0 V) | Rx Path | 0 V | 0 V | 0 | 0 |
| 11 | Output (LP Tx low = 0 V) | Output (SDP Tx high = 3.3 V) | Rx Path | 0 V | 3.3 V | 0 | 3.3 V/R |
| 12 | Output (LP Tx high = 5.5 V) | Off | Off | 5.5 V | 0 V | 0 | 0 |
| 13 | Output (LP Tx high = 5.5 V) | Input | Tx Path | 5.5 V | 0 V | 5.5 V/R | 0 |
| 14 | Output (LP Tx high = 5.5 V) | Output (SDP Tx low = 0 V) | Tx Path | 5.5 V | 0 V | 5.5 V/R | 0 |
| 15 | Output (LP Tx high = 5.5 V) | Output (SDP Tx high = 3.3 V) | Tx Path | 5.5 V | 3.3 V | 1.2 V/R | 0 |
| 16 | Output (LP Tx high = 5.5 V) | Output (SDP Tx low = 0 V) | Rx Path | 5.5 V | 0 V | 0 | 3.3 V/R |
| 17 | Output (LP Tx high = 5.5 V) | Output (SDP Tx high = 3.3 V) | Rx Path | 5.5 V | 3.3 V | 0 | 0 |
| 18 | Input | Off | Off | 0 V | 0 V | 0 | 0 |
| 19 | Input | Input | Tx Path | 0 V | 0 V | 0 | 0 |
| 20 | Input | Input | Rx Path | 0 V | 0 V | 0 | 0 |
| 21 | Input | Output (SDP Tx low = 0 V) | Rx Path | 0 V | 0 V | 0 | 0 |
| 22 | Input | Output (SDP Tx high = 3.3 V) | Rx Path | 0 V | 3.3 V | 0 | 3.3 V/R |
| 23 | Off | Input | Tx Path | 0 V | 0 V | 0 | 0 |
| 24 | Off | Input | Rx Path | 0 V | 0 V | 0 | 0 |
| 25 | Off | Output (SDP Tx low = 0 V) | Tx Path | 0 V | 0 V | 0 | 0 |
| 26 | Off | Output (SDP Tx low = 0 V) | Rx Path | 0 V | 0 V | 0 | 0 |

TABLE 3-continued

| | User Configurations | | | Results | | | |
|---|---|---|---|---|---|---|---|
| | | | Path | | | | |
| | Link Partner Setup | Controller Timing SDP Setup | Enabled via Control Logic SDPs | Voltage at SMA | Voltage at Controller SDP (must be <3.3 V) | Current at OpAmp Output Resistor | Current Sourced/Sinked by Controller (must be <12 mA) |
| 27 | Off | Output (SDP Tx high = 3.3 V) | Tx Path | 3.3 V | 3.3 V | 0 | 0 |
| 28 | Off | Output (SDP Tx high = 3.3 V) | Rx Path | 0 V | 3.3 V | 0 | 3.3 V/R |

Figure 4:
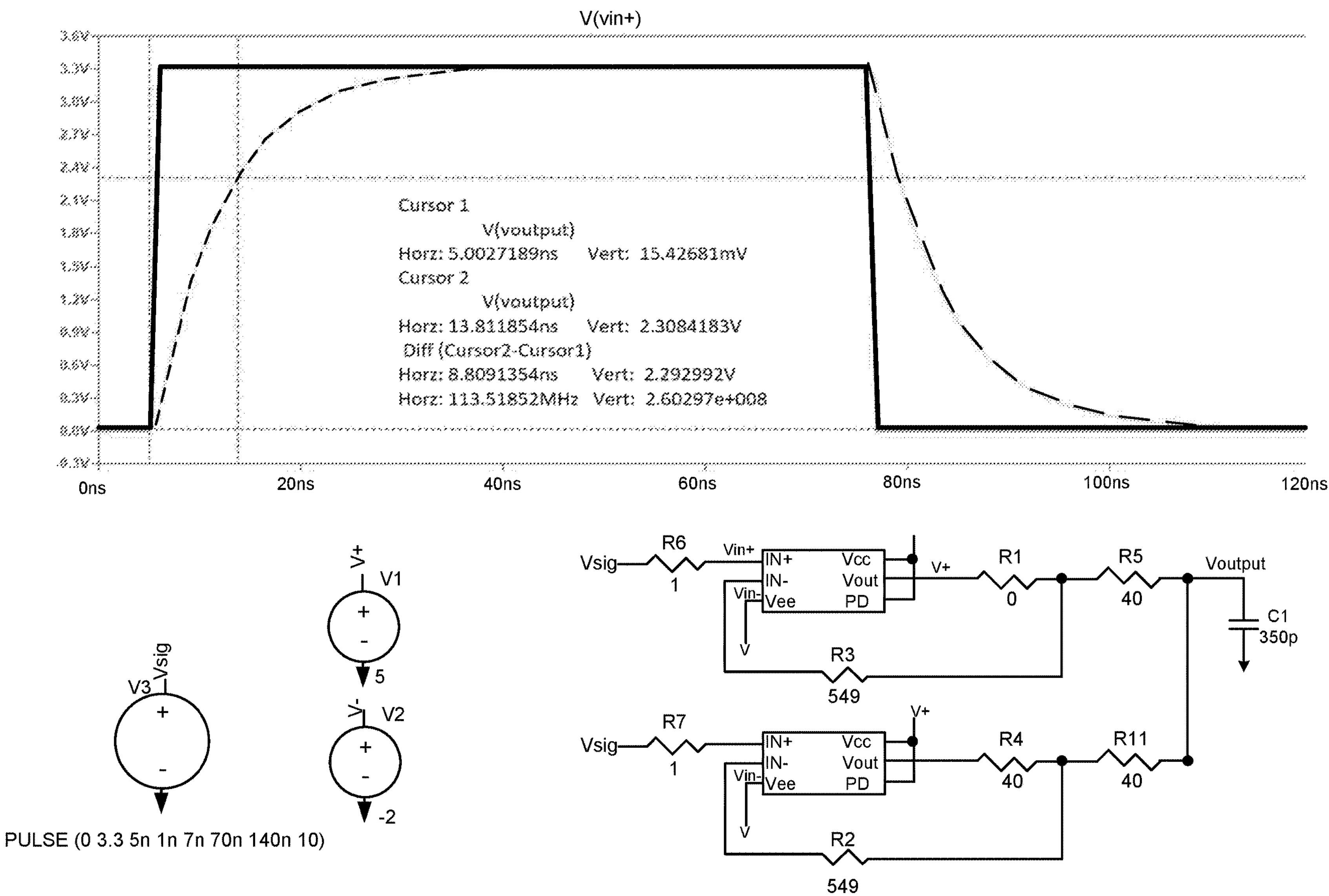
FIG. 4 depicts an example simulation of rise time for a circuit.

FIG. 4 depicts an example simulation of rise time for a protected controlled latency circuit. This simulation shows rise time for a buffer in series with a protection resistor (40 ohms) in parallel with another buffer in series with a protection resistor (40 ohms). Two operational amplifiers and their respective power resistors in parallel resulted in a lower equivalent series resistance and the ability to source enough current to reduce rise time to within an acceptable level. Table 4 also illustrates the simulated rise time.

TABLE 4

| | |
|---|---|
| Series Resistance (ohms) | 20 |
| Load Capacitance (pF) | 350 |
| Time Constant (ns) | 7 |
| Vsignal | 3.3 |
| % Rise Time | 0.7 |
| Voh | 2.31 |
| Rise Time to Voh (ns) | 8.42781 |

Figure 5A:
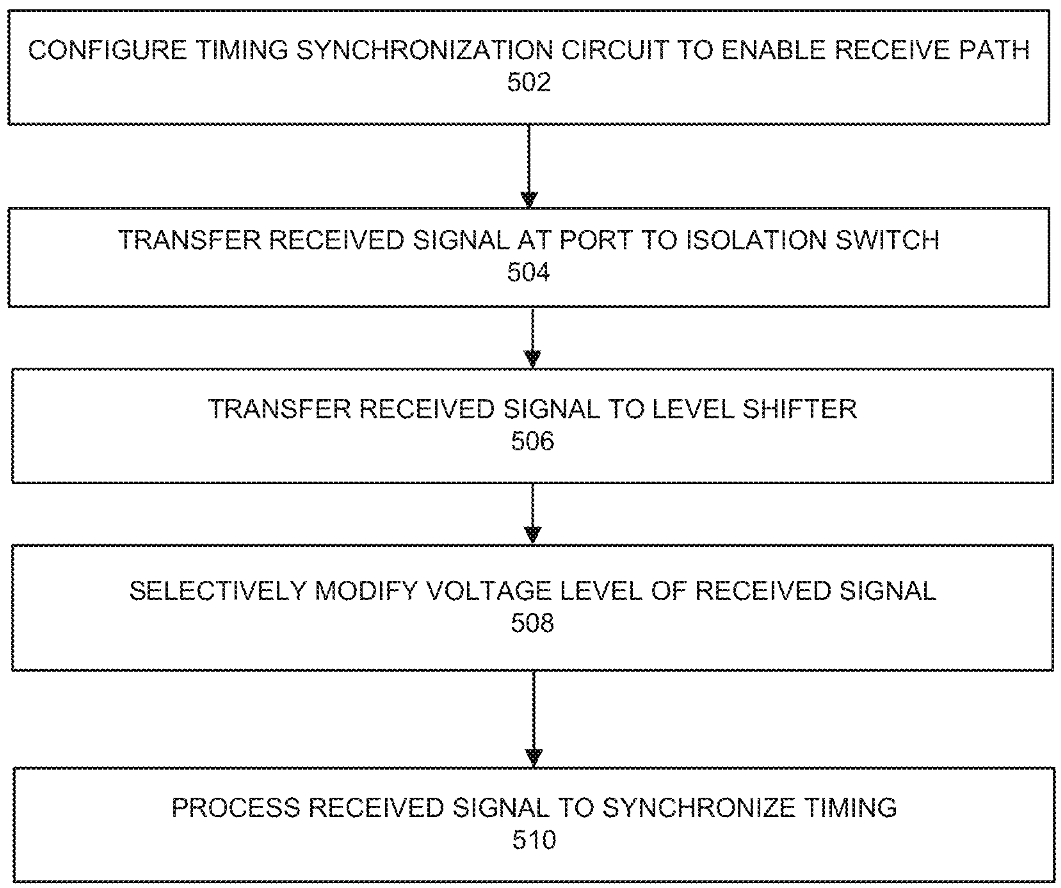
FIG. 5A depicts a process to receive a signal using a timing synchronization of circuit of a network interface.

FIG. 5A depicts a process to receive a signal using a timing synchronization of circuit of a network interface. At 502, a timing transmit/receive circuit is configured to enable a signal receipt circuit path. For example, a user or software (e.g., driver) can configure a timing synchronization of circuit of a network interface. For example, an isolation switch and level shifter can be enabled.

At 504, a received signal at the timing transmit/receive circuit is transferred to an isolation switch. The received signal can be received at a subminiature adapter (SMA) and be a radio frequency (RF) signal. For example, the received signal can include a clock pulse of 1 pulse/second to indicate a start of new second. A termination resistor at the input of the level shifter is used to avoid transmission line reflection but is disabled when the device is enabled for transmission.

At 506, the received signal is transferred from the isolation switch to a level shifter. The level shifter can shift an amplitude range of the received signal to voltage range accepted by system controller. For example, input range could be 1.65 to 5.5V, then the output would be the level shifter's VCC voltage.

At 508, the level shifter provides the amplitude shifted signal to a system controller through a current protection resistor. The current protection resistor can dissipate a voltage provided by a transmitted signal from timing controller in the event of mistaken simultaneous signal transmission and receipt.

At 510, a system controller processes a received clock pulse. The clock pulse can provide 1 pulse per second (PPS) or 10 MHz signal in reference to sections 19.2 and 20 of ITU-T G.703 (2016). The system controller can align its timing circuit such as a phase locked loop with the clock pulse to achieve clock synchronization with another device. Use of IEEE 1588 PTP timing synchronization can be used. The system controller has the right time so it can communicate time to another device under precision time protocol (PTP). A delay due to use of current protection resistor can be taken into account by adjusting a time stamp of a received clock pulse to be earlier in time by an amount of the delay.

Figure 5B:
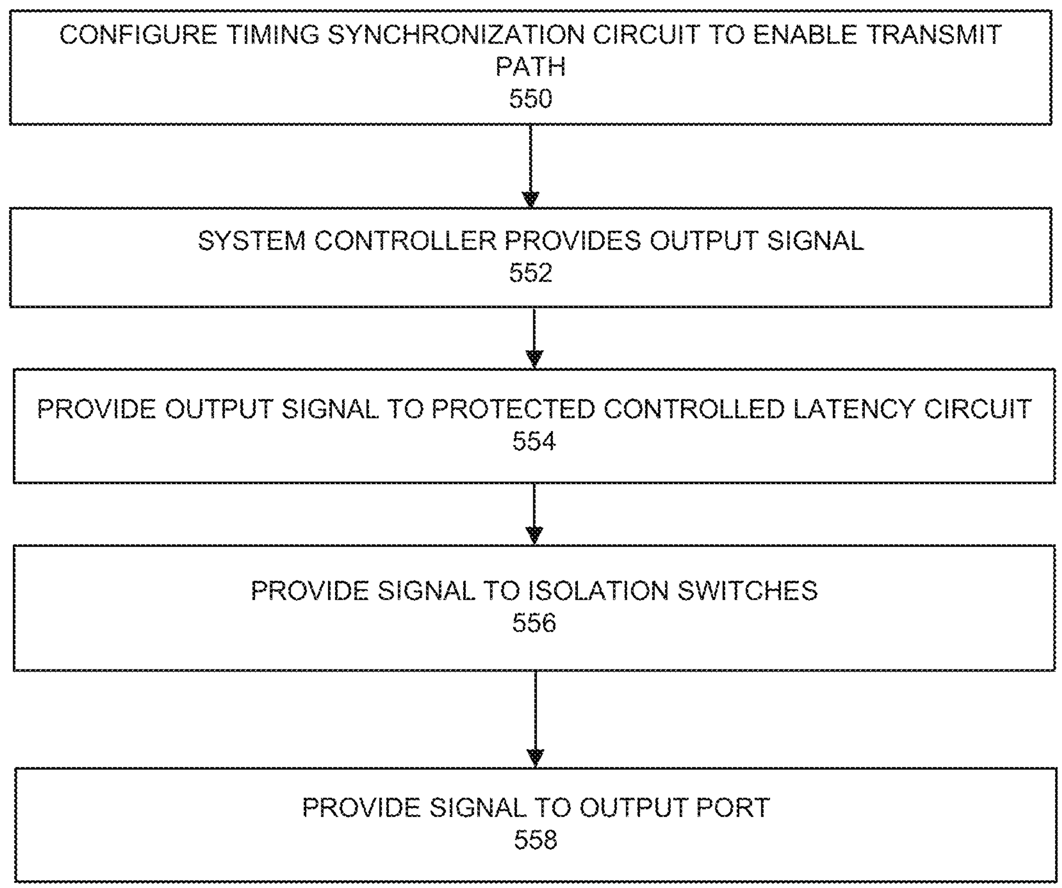
FIG. 5B depicts a process to transmit a signal using a timing synchronization of circuit of a network interface.

FIG. 5B depicts a process to transmit a signal using a timing synchronization of circuit of a network interface. At 550, a timing transmit/receive circuit is configured to enable a signal transmit circuit path. For example, a user or software (e.g., driver) can configure a timing synchronization of circuit of a network interface. For example, enablement can occur for a signal path through a parallel connected combination of buffer in series with protection resistors and a parallel connected combination of isolation switches.

At 552, an output signal can be provided from a system controller. The output signal can be time signals such as a signal that identifies a start of a second or other defined time period. The output signal can be transmitted to another device to permit the other device to synchronize its timing system using the transmitted signal.

At 554, the output signal can be provided to a protected controlled latency circuit. The protected controlled latency circuit can include parallel connected combination of buffer in series with protection resistors. The output signal can include a clock pulse of 1 pulse per second (PPS) in reference to section 19.2 of ITU-T G.703 (2016). A 10 MHz signal can be used for timing synchronization in accordance with section 20 of ITU-T G.703. Other frequencies besides 10 MHz can be used such as higher or lower frequencies. Other timing signals can be used. The protection series resistor can be used to absorb current and protects against high input current (e.g., 130 mA) received at the buffer to protect the op amp from damage.

At 556, the protected controlled latency can provide a signal to the parallel connected combination of isolation switches. At 558, the parallel connected combination of isolation switches provide an output signal to an output port for transmission to another device.

Figure 6:
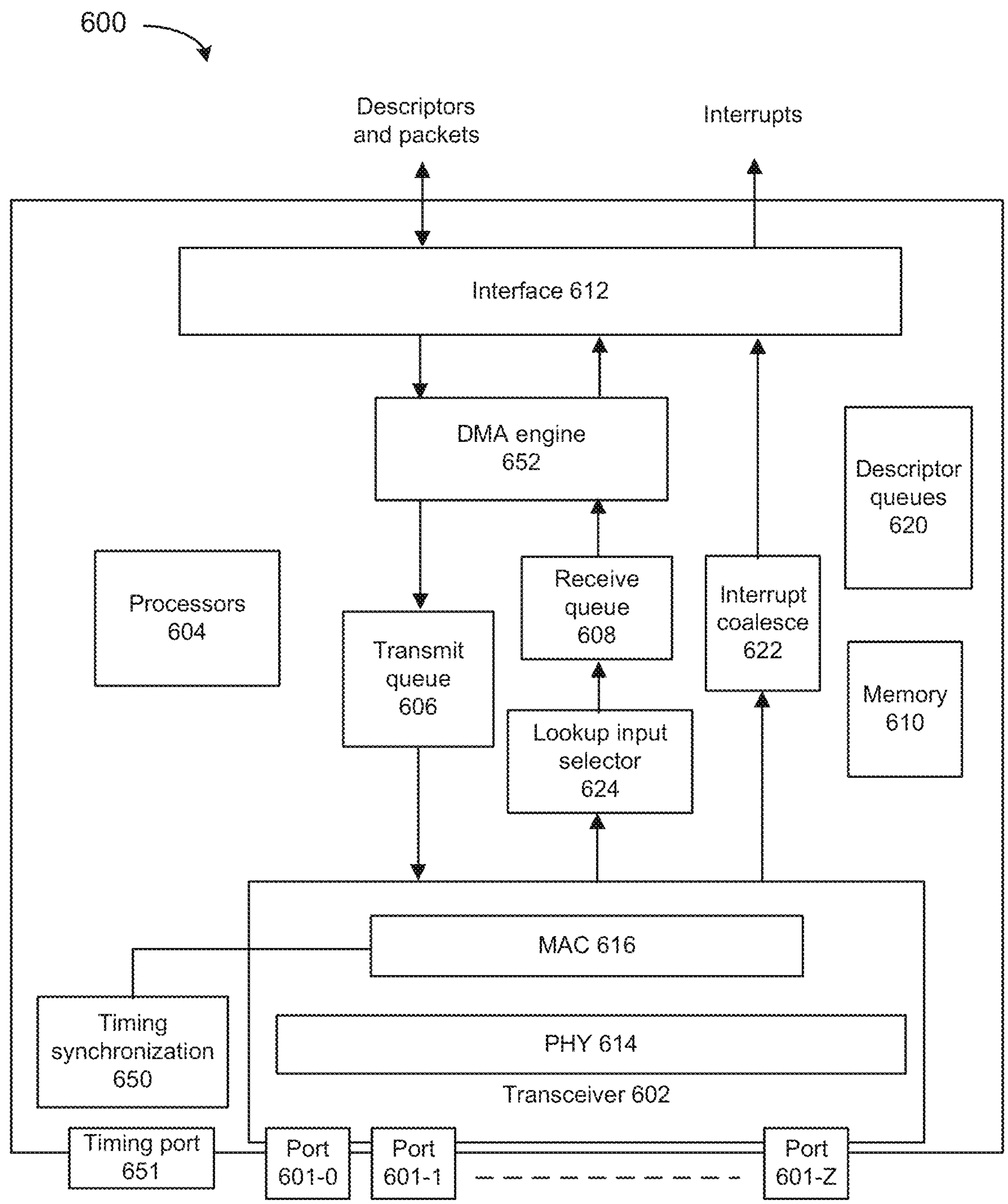
FIG. 6 depicts an example of a network interface.

FIG. 6 depicts an example of a network interface. Transceiver 602 can be capable of receiving and transmitting packets using various ports 601-0 to 601-Z in conformance with the applicable protocols such as Ethernet as described in IEEE 802.3, although other protocols may be used.

Transceiver 602 can receive and transmit packets from and to a network via a network medium (not depicted). A network medium can be a wired or wireless medium. A wired medium can conduct electrical and/or optical signals. For example, a medium can be any type of cable such as but not limited to optical fiber (e.g., 25GBASE-SX, 25GBASE-LX, 1000BASE-X, 1000BASE-SX, 1000BASE-LX, 1000BASE-BX, 1000BASE-RHx, or 1000BASE-PX), twisted pair cable (e.g., 1000BASE-T, 1000BASE-T1, 1000BASE-TX), shielded balanced copper cable (e.g., 1000BASE-CX), copper backplane (e.g., 1000BASE-KX), as well as other speeds (e.g., 10G).

Transceiver 602 can include PHY circuitry 614 and media access control (MAC) circuitry 616. PHY circuitry 614 can include encoding and decoding circuitry (not shown) to encode and decode data packets according to applicable physical layer specifications or standards. MAC circuitry 616 can be configured to assemble data to be transmitted into packets, that include destination and source addresses along with network control information and error detection hash values.

Processors 604 can be any combination of a: processor, core, graphics processing unit (GPU), field programmable gate array (FPGA), application specific integrated circuit (ASIC), or other programmable hardware device that allow programming of network interface 600. For example, processors 604 can provide for identification of a resource to use to perform a workload and generation of a bitstream for execution on the selected resource. For example, a "smart network interface" can provide packet processing capabilities in the network interface using processors 604.

Packet allocator 624 can provide distribution of received packets for processing by multiple CPUs or cores using timeslot allocation described herein or RSS. When packet allocator 624 uses RSS, packet allocator 624 can calculate a hash or make another determination based on contents of a received packet to determine which CPU or core is to process a packet.

Interrupt coalesce 622 can perform interrupt moderation whereby network interface interrupt coalesce 622 waits for multiple packets to arrive, or for a time-out to expire, before generating an interrupt to host system to process received packet(s). Receive Segment Coalescing (RSC) can be performed by network interface 600 whereby portions of incoming packets are combined into segments of a packet. Network interface 600 provides this coalesced packet to an application.

Direct memory access (DMA) engine 652 can copy a packet header, packet payload, and/or descriptor directly from host memory to the network interface or vice versa, instead of copying the packet to an intermediate buffer at the host and then using another copy operation from the intermediate buffer to the destination buffer.

Timing synchronization system 650 can receive or transmit timing related signals using timing port 651. Timing synchronization system 650 can use circuitry and embodiments described herein to transmit or receive at least timing-related signals and provide protection against circuit damage from misconfigured port use while providing acceptable propagation delay. Note that timing signals can be received and transmitted through timing port 651 in addition to or separate from timing signals provided through ports 601-0 to 601-Z.

Memory 610 can be any type of volatile or non-volatile memory device and can store any queue or instructions used to program network interface 600. Transmit queue 606 can include data or references to data for transmission by network interface. Receive queue 608 can include data or references to data that was received by network interface from a network. Descriptor queues 620 can include descriptors that reference data or packets in transmit queue 606 or receive queue 608. Bus interface 612 can provide an interface with host device (not depicted). For example, bus interface 612 can be compatible with PCI, PCI Express, PCI-x, Serial ATA, and/or USB compatible interface (although other interconnection standards may be used).

Figure 7:
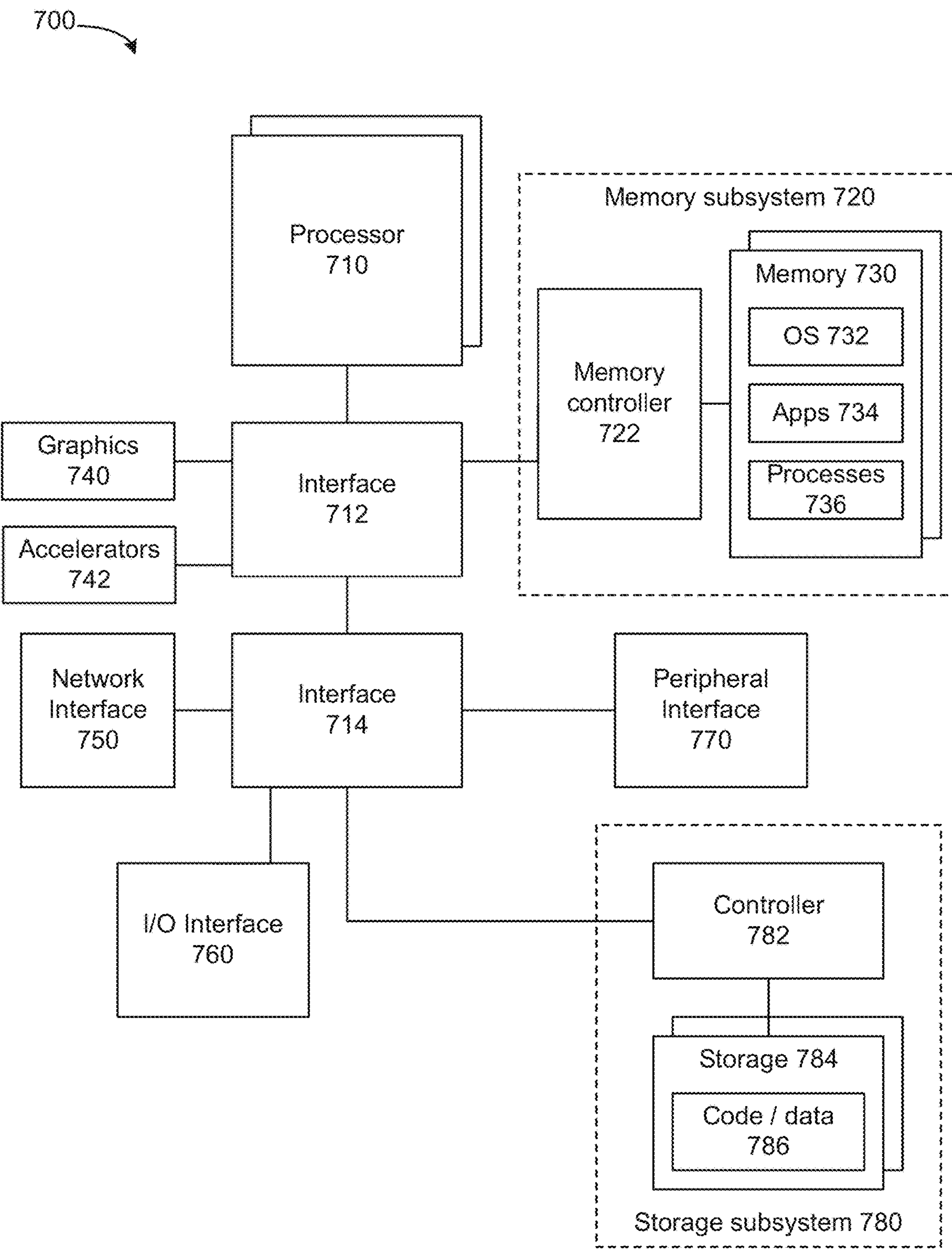
FIG. 7 depicts a system.

FIG. 7 depicts a system. The system can use embodiments described herein to provide timing synchronization with another device in accordance with embodiments described herein. System 700 includes processor 710, which provides processing, operation management, and execution of instructions for system 700. Processor 710 can include any type of microprocessor, central processing unit (CPU), graphics processing unit (GPU), processing core, or other processing hardware to provide processing for system 700, or a combination of processors. Processor 710 controls the overall operation of system 700, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

In one example, system 700 includes interface 712 coupled to processor 710, which can represent a higher speed interface or a high throughput interface for system components that needs higher bandwidth connections, such as memory subsystem 720 or graphics interface components 740, or accelerators 742. Interface 712 represents an interface circuit, which can be a standalone component or integrated onto a processor die. Where present, graphics interface 740 interfaces to graphics components for providing a visual display to a user of system 700. In one example, graphics interface 740 can drive a high definition (HD) display that provides an output to a user. High definition can refer to a display having a pixel density of approximately 100 PPI (pixels per inch) or greater and can include formats such as full HD (e.g., 1080p), retina displays, 4K (ultra-high definition or UHD), or others. In one example, the display can include a touchscreen display. In one example, graphics interface 740 generates a display based on data stored in memory 730 or based on operations executed by processor 710 or both. In one example, graphics interface 740 generates a display based on data stored in memory 730 or based on operations executed by processor 710 or both.

Accelerators 742 can be a fixed function offload engine that can be accessed or used by a processor 710. For example, an accelerator among accelerators 742 can provide compression (DC) capability, cryptography services such as public key encryption (PKE), cipher, hash/authentication capabilities, decryption, or other capabilities or services. In some embodiments, in addition or alternatively, an accelerator among accelerators 742 provides field select controller capabilities as described herein. In some cases, accelerators 742 can be integrated into a CPU socket (e.g., a connector to a motherboard or circuit board that includes a CPU and provides an electrical interface with the CPU). For example, accelerators 742 can include a single or multi-core processor, graphics processing unit, logical execution unit single or multi-level cache, functional units usable to independently execute programs or threads, application specific integrated circuits (ASICs), neural network processors (NNPs), programmable control logic, and programmable processing elements such as field programmable gate arrays (FPGAs) or programmable logic devices (PLDs). Accelerators 742 can provide multiple neural networks, CPUs, processor cores, general purpose graphics processing units, or graphics processing units can be made available for use by artificial intelligence (AI) or machine learning (ML) models. For example, the AI model can use or include any or a combination of: a reinforcement learning scheme, Q-learning scheme, deep-Q learning, or Asynchronous Advantage Actor-Critic (A3C), combinatorial neural network, recurrent combinatorial neural network, or other AI or ML model. Multiple neural networks, processor cores, or graphics processing units can be made available for use by AI or ML models.

Memory subsystem 720 represents the main memory of system 700 and provides storage for code to be executed by processor 710, or data values to be used in executing a routine. Memory subsystem 720 can include one or more memory devices 730 such as read-only memory (ROM), flash memory, one or more varieties of random access memory (RAM) such as DRAM, or other memory devices, or a combination of such devices. Memory 730 stores and hosts, among other things, operating system (OS) 732 to provide a software platform for execution of instructions in system 700. Additionally, applications 734 can execute on the software platform of OS 732 from memory 730. Applications 734 represent programs that have their own operational logic to perform execution of one or more functions. Processes 736 represent agents or routines that provide auxiliary functions to OS 732 or one or more applications 734 or a combination. OS 732, applications 734, and processes 736 provide software logic to provide functions for system 700. In one example, memory subsystem 720 includes memory controller 722, which is a memory controller to generate and issue commands to memory 730. It will be understood that memory controller 722 could be a physical part of processor 710 or a physical part of interface 712. For example, memory controller 722 can be an integrated memory controller, integrated onto a circuit with processor 710.

While not specifically illustrated, it will be understood that system 700 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a Hyper Transport or industry standard architecture (ISA) bus, a small computer system interface (SCSI) bus, a universal serial bus (USB), or an Institute of Electrical and Electronics Engineers (IEEE) standard 1394 bus (Firewire).

In one example, system 700 includes interface 714, which can be coupled to interface 712. In one example, interface 714 represents an interface circuit, which can include standalone components and integrated circuitry. In one example, multiple user interface components or peripheral components, or both, couple to interface 714. Network interface 750 provides system 700 the ability to communicate with remote devices (e.g., servers or other computing devices) over one or more networks. Network interface 750 can include an Ethernet adapter, wireless interconnection components, cellular network interconnection components, USB (universal serial bus), or other wired or wireless standards-based or proprietary interfaces. Network interface 750 can transmit data to a device that is in the same data center or rack or a remote device, which can include sending data stored in memory. Network interface 750 can receive data from a remote device, which can include storing received data into memory. Various embodiments can be used in connection with network interface 750, processor 710, and memory subsystem 720. Various embodiments of network interface 750 use embodiments described herein to receive or transmit timing related signals and provide protection against circuit damage from misconfigured port use while providing acceptable propagation delay.

In one example, system 700 includes one or more input/output (I/O) interface(s) 760. I/O interface 760 can include one or more interface components through which a user interacts with system 700 (e.g., audio, alphanumeric, tactile/touch, or other interfacing). Peripheral interface 770 can include any hardware interface not specifically mentioned above. Peripherals refer generally to devices that connect dependently to system 700. A dependent connection is one where system 700 provides the software platform or hardware platform or both on which operation executes, and with which a user interacts.

In one example, system 700 includes storage subsystem 780 to store data in a nonvolatile manner. In one example, in certain system implementations, at least certain components of storage 780 can overlap with components of memory subsystem 720. Storage subsystem 780 includes storage device(s) 784, which can be or include any conventional medium for storing large amounts of data in a nonvolatile manner, such as one or more magnetic, solid state, or optical based disks, or a combination. Storage 784 holds code or instructions and data 786 in a persistent state (i.e., the value is retained despite interruption of power to system 700). Storage 784 can be generically considered to be a "memory," although memory 730 is typically the executing or operating memory to provide instructions to processor 710. Whereas storage 784 is nonvolatile, memory 730 can include volatile memory (i.e., the value or state of the data is indeterminate if power is interrupted to system 700). In one example, storage subsystem 780 includes controller 782 to interface with storage 784. In one example controller 782 is a physical part of interface 714 or processor 710 or can include circuits or logic in both processor 710 and interface 714.

A volatile memory is memory whose state (and therefore the data stored in it) is indeterminate if power is interrupted to the device. Dynamic volatile memory uses refreshing the data stored in the device to maintain state. One example of dynamic volatile memory incudes DRAM (Dynamic Random Access Memory), or some variant such as Synchronous DRAM (SDRAM). A memory subsystem as described herein may be compatible with a number of memory technologies, such as DDR3 (Double Data Rate version 3, original release by JEDEC (Joint Electronic Device Engineering Council) on Jun. 27, 2007). DDR4 (DDR version 4, initial specification published in September 2012 by JEDEC), DDR4E (DDR version 4), LPDDR3 (Low Power DDR version3, JESD209-3B, August 2013 by JEDEC), LPDDR4) LPDDR version 4, JESD209-4, originally published by JEDEC in August 2014), WIO2 (Wide Input/output version 2, JESD229-2 originally published by JEDEC in August 2014, HBM (High Bandwidth Memory, JESD325, originally published by JEDEC in October 2013, LPDDR5 (currently in discussion by JEDEC), HBM2 (HBM version 2), currently in discussion by JEDEC, or others or combinations of memory technologies, and technologies based on derivatives or extensions of such specifications. The JEDEC standards are available at www.jedec.org.

A non-volatile memory (NVM) device is a memory whose state is determinate even if power is interrupted to the device. In one embodiment, the NVM device can comprise a block addressable memory device, such as NAND technologies, or more specifically, multi-threshold level NAND flash memory (for example, Single-Level Cell ("SLC"), Multi-Level Cell ("MLC"), Quad-Level Cell ("QLC"), Tri-Level Cell ("TLC"), or some other NAND). A NVM device can also comprise a byte-addressable write-in-place three dimensional cross point memory device, or other byte addressable write-in-place NVM device (also referred to as persistent memory), such as single or multi-level Phase Change Memory (PCM) or phase change memory with a switch (PCMS), NVM devices that use chalcogenide phase change material (for example, chalcogenide glass), resistive memory including metal oxide base, oxygen vacancy base and Conductive Bridge Random Access Memory (CB-RAM), nanowire memory, ferroelectric random access memory (FeRAM, FRAM), magneto resistive random access memory (MRAM) that incorporates memristor technology, spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory.

A power source (not depicted) provides power to the components of system 700. More specifically, power source typically interfaces to one or multiple power supplies in system 700 to provide power to the components of system 700. In one example, the power supply includes an AC to DC (alternating current to direct current) adapter to plug into a wall outlet. Such AC power can be renewable energy (e.g., solar power) power source. In one example, power source includes a DC power source, such as an external AC to DC converter. In one example, power source or power supply includes wireless charging hardware to charge via proximity to a charging field. In one example, power source can include an internal battery, alternating current supply, motion-based power supply, solar power supply, or fuel cell source.

In an example, system 700 can be implemented using interconnected compute sleds of processors, memories, storages, network interfaces, and other components. High speed interconnects can be used such as: Ethernet (IEEE 802.3), remote direct memory access (RDMA), InfiniBand, Internet Wide Area RDMA Protocol (iWARP), quick UDP Internet Connections (QUIC), RDMA over Converged Ethernet (RoCE), Peripheral Component Interconnect express (PCIe), Intel QuickPath Interconnect (QPI), Intel Ultra Path Interconnect (UPI), Intel On-Chip System Fabric (IOSF), Omnipath, Compute Express Link (CXL), HyperTransport, high-speed fabric, NVLink, Advanced Microcontroller Bus Architecture (AMBA) interconnect, OpenCAPI, Gen-Z, Cache Coherent Interconnect for Accelerators (CCIX), 3GPP Long Term Evolution (LTE) (4G), 3GPP 5G, and variations thereof. Data can be copied or stored to virtualized storage nodes using a protocol such as NVMe over Fabrics (NVMe-oF) or NVMe.

Embodiments herein may be implemented in various types of computing and networking equipment, such as switches, routers, racks, and blade servers such as those employed in a data center and/or server farm environment. The servers used in data centers and server farms comprise arrayed server configurations such as rack-based servers or blade servers. These servers are interconnected in communication via various network provisions, such as partitioning sets of servers into Local Area Networks (LANs) with appropriate switching and routing facilities between the LANs to form a private Intranet, part of the Internet, public cloud, private cloud, or hybrid cloud. For example, cloud hosting facilities may typically employ large data centers with a multitude of servers. A blade comprises a separate computing platform that is configured to perform server-type functions, that is, a "server on a card." Accordingly, each blade includes components common to conventional servers, including a main printed circuit board (main board) providing internal wiring (i.e., buses) for coupling appropriate integrated circuits (ICs) and other components mounted to the board.

Figure 8:
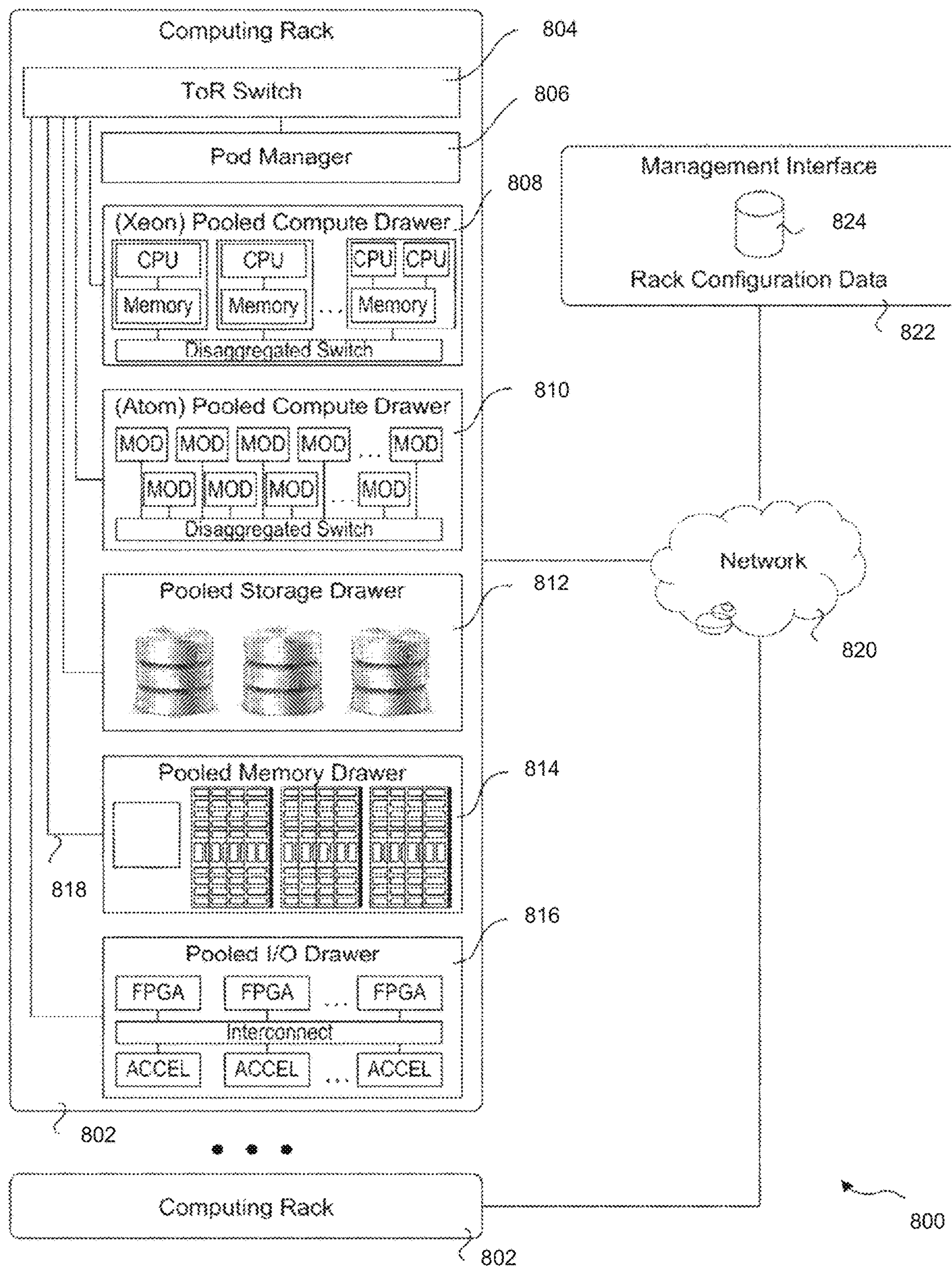
FIG. 8 depicts an environment

FIG. 8 depicts an environment 800 includes multiple computing racks 802, each including a Top of Rack (ToR) switch 804, a pod manager 806, and a plurality of pooled system drawers. Generally, the pooled system drawers may include pooled compute drawers and pooled storage drawers. Optionally, the pooled system drawers may also include pooled memory drawers and pooled Input/Output (I/O) drawers. In the illustrated embodiment the pooled system drawers include an Intel® Xeon® processor pooled computer drawer 808, and Intel® ATOM™ processor pooled compute drawer 810, a pooled storage drawer 812, a pooled memory drawer 814, and a pooled I/O drawer 816. Each of the pooled system drawers is connected to ToR switch 804 via a high-speed link 818, such as a 40 Gigabit/second (Gb/s) or 100 Gb/s Ethernet link or a 100+Gb/s Silicon Photonics (SiPh) optical link. In one embodiment high-speed link 818 comprises an 800 Gb/s SiPh optical link.

Multiple of the computing racks 802 may be interconnected via their ToR switches 804 (e.g., to a pod-level switch or data center switch), as illustrated by connections to a network 820. In some embodiments, groups of computing racks 802 are managed as separate pods via pod manager(s) 806. In one embodiment, a single pod manager is used to manage all of the racks in the pod. Alternatively, distributed pod managers may be used for pod management operations.

Environment 800 further includes a management interface 822 that is used to manage various aspects of the environment. This includes managing rack configuration, with corresponding parameters stored as rack configuration data 824.

In some examples, network interface and other embodiments described herein can be used in connection with a base station (e.g., 3G, 4G, 5G and so forth), macro base station (e.g., 5G networks), picostation (e.g., an IEEE 802.11 compatible access point), nanostation (e.g., for Point-to-MultiPoint (PtMP) applications), on-premises data centers, off-premises data centers, edge network elements, fog network elements, and/or hybrid data centers (e.g., data center that use virtualization, cloud and software-defined networking to deliver application workloads across physical data centers and distributed multi-cloud environments).

For example, various embodiments can be used for wired or wireless protocols (e.g., 3GPP Long Term Evolution (LTE) (4G) or 3GPP 5G), on-premises data centers, off-premises data centers, base station devices, sensor data sender or receiver devices (e.g., for autonomous vehicles or augmented reality applications), endpoint devices, servers, routers, edge network elements (computing elements provided physically closer to a base station or network access point than a data center), fog network elements (computing elements provided physically closer to a base station or network access point than a data center but further from an edge network), and/or hybrid data centers (e.g., data center that use virtualization, cloud and software-defined networking to deliver application workloads across physical data centers and distributed multi-cloud environments). Network or computing elements can be used in local area network (LAN), metropolitan area network (MAN), network with devices connected using optical fiber links, campus area network (CAN), or wide area network (WAN).

In some examples, network interface and other embodiments described herein can be used in connection with a base station (e.g., 3G, 4G, 5G and so forth), macro base station (e.g., 5G networks), picostation (e.g., an IEEE 802.11 compatible access point), nanostation (e.g., for Point-to-MultiPoint (PtMP) applications).

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, ASICs, PLDs, DSPs, FPGAs, memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation. It is noted that hardware, firmware and/or software elements may be collectively or individually referred to herein as "module," "logic," "circuit," or "circuitry." A processor can be one or more combination of a hardware state machine, digital control logic, central processing unit, or any hardware, firmware and/or software elements.

Some examples may be implemented using or as an article of manufacture or at least one computer-readable medium. A computer-readable medium may include a non-transitory storage medium to store logic. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the logic may include various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

One or more aspects of at least one example may be implemented by representative instructions stored on at least one machine-readable medium which represents various logic within the processor, which when read by a machine, computing device or system causes the machine, computing device or system to fabricate logic to perform the techniques described herein. Such representations, known as "IP cores" may be stored on a tangible, machine readable medium and supplied to various customers or manufacturing facilities to load into the fabrication machines that actually make the logic or processor.

The appearances of the phrase "one example" or "an example" are not necessarily all referring to the same example or embodiment. Any aspect described herein can be combined with any other aspect or similar aspect described herein, regardless of whether the aspects are described with respect to the same figure or element. Division, omission or inclusion of block functions depicted in the accompanying figures does not infer that the hardware components, circuits, software and/or elements for implementing these functions would necessarily be divided, omitted, or included in embodiments.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

The terms "first," "second," and the like, herein do not denote any order, quantity, or importance, but rather are used to distinguish one element from another. The terms "a" and "an" herein do not denote a limitation of quantity, but rather denote the presence of at least one of the referenced items. The term "asserted" used herein with reference to a signal denote a state of the signal, in which the signal is active, and which can be achieved by applying any logic level either logic 0 or logic 1 to the signal. The terms "follow" or "after" can refer to immediately following or following after some other event or events. Other sequences of steps may also be performed according to alternative embodiments. Furthermore, additional steps may be added or removed depending on the particular applications. Any combination of changes can be used and one of ordinary skill in the art with the benefit of this disclosure would understand the many variations, modifications, and alternative embodiments thereof.

Disjunctive language such as the phrase "at least one of X, Y, or Z," unless specifically stated otherwise, is otherwise understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present. Additionally, conjunctive language such as the phrase "at least one of X, Y, and Z," unless specifically stated otherwise, should also be understood to mean X, Y, Z, or any combination thereof, including "X, Y, and/or Z."'

Illustrative examples of the devices, systems, and methods disclosed herein are provided below. An embodiment of the devices, systems, and methods may include any one or more, and any combination of, the examples described below.

An example includes: measurement of packet processing activity includes measurement of a portion of a performance monitoring unit (PMU) register of the first core, the PMU register includes a branch hit/miss measurement, the second core is to execute a power management process to determine a network interface activity level based on the branch hit/miss measurement, and selectively modifying a level of activity of a first core based on the encrypted measurement of packet processing activity, where a second core is to selectively modify a frequency of operation of the first core based on the branch hit/miss measurement.

Example 1 includes an apparatus comprising: a time synchronization device, wherein: the time synchronization device comprises a transmit circuitry path, the transmit circuitry path is to protect against signals received through the transmit circuitry path and provide a controlled signal propagation latency, and the time synchronization device is to transfer a timing signal for transmission.

Example 2 includes any example, wherein the transmit circuitry path is to provide single-digit nanosecond rise time for a transmitted timing signal.

Example 3 includes any example, wherein the transmit circuitry path comprises a protected controlled latency circuit coupled to an isolation circuitry.

Example 4 includes any example, wherein the protected controlled latency circuit comprises a buffer and current regulating circuitry coupled in parallel with at least N other sets of a buffer and other current regulating circuitry.

Example 5 includes any example, wherein, within a set, a current regulating circuitry comprises a resistor to reduce current level received at a buffer due a voltage applied at an input/output port during transmission mode, and wherein N effects an RC time constant of the transmit circuitry path.

Example 6 includes any example, further comprising isolation circuitry to isolate voltage received at an output from the transmit circuitry path during transmission mode.

Example 7 includes any example, wherein the timing signal comprises one or more of: a 1 PPS signal, at least a 10 MHz signal, or another clock signal.

Example 8 includes any example, further comprising an input/output port coupled to the time synchronization device.

Example 9 includes any example, wherein the time synchronization device comprises a receive circuitry path, wherein the receive circuitry path comprises one or more of: an isolation circuit in the receive circuitry path of an input/output port and circuitry to accommodate different levels of voltage of a received signal.

Example 10 includes any example, wherein the receive circuitry path comprises one or more of: current regulating circuitry located between the isolation circuit and the circuitry to accommodate different levels of voltage and second current regulating circuitry between the circuitry to accommodate different levels of voltage and a system controller.

Example 11 includes any example, comprising a system controller, the system controller to calibrate a timing signal based on the received signal based on a primary-secondary clock scheme, wherein the received signal comprises a 1 PPS signal, a 10 MHz signal, or other frequency clock signal.

Example 12 includes any example, wherein the primary-secondary clock scheme comprises IEEE 1588 Precision Time Protocol (PTP).

Example 13 includes any example, comprising a network interface coupled to the time synchronization device, the network interface to transmit and receive data packets.

Example 14 includes any example, comprising a rack, server, or data center.

Example 15 includes a method comprising: performing time synchronization using a circuit that provides protection against circuit damage from misconfigured port use of signal transmission during receive mode or signal receipt during transmit mode and commensurate with providing protection, providing controlled latency of a transmit signal.

Example 16 includes any example, wherein the circuit comprises a transmit path comprising: a set of a buffer in series with a current regulating circuitry coupled in parallel with at least N other sets of a buffer in series with a current regulating circuitry, wherein a number N adjusts an RC time constant of the transmit path.

Example 17 includes any example, wherein the circuit comprises a receive circuitry path that comprises one or more of: an isolation circuit connected to an input/output port; circuitry to accommodate different levels of voltage; a current regulating circuitry located between the isolation circuit and the circuitry to accommodate different levels of voltage; and a second current regulating circuitry between the circuitry to accommodate different levels of voltage and a system controller.

Example 18 includes any example, comprising calibrating a timing signal using a received signal and based on a primary-secondary clock scheme, wherein the received signal comprises a 1 PPS signal, a 10 MHz signal, or other frequency clock signal.

Example 19 includes a system comprising: at least one memory; at least one processor coupled to the at least one memory; and a network interface comprising a timing synchronization system, wherein the timing synchronization system comprises: a transmit circuitry path that is to protect against signals received through the transmit circuitry path and provide a controlled signal propagation latency and a receive circuitry path.

Example 20 includes any example, wherein the transmit circuitry path comprises: a set of buffer in series with a resistor coupled in parallel with at least N other sets of buffer in series with a current regulating circuit, wherein a number N effects an RC time constant.

Example 21 includes any example, wherein the timing synchronization system is to calibrate a timing signal using a received signal and based on a primary-secondary clock scheme.

What is claimed is:

1. An apparatus comprising:

a circuitry to generate a timing signal by calibration of the timing signal and a received signal and based on a primary-secondary clock scheme, wherein the received signal comprises a 1 PPS signal, a 10 MHz signal, or other frequency clock signal;

a receive circuitry path to transfer the received signal to the circuitry, wherein the receive circuitry path comprises an isolation circuit and second circuitry to receive different voltage level ranges of the received signal;

a transmit circuitry path to transfer the timing signal for transmission; and an input/output port coupled to the isolation circuit and the transmit circuitry path, wherein the transmit circuitry path comprises a protected controlled latency circuit coupled to an isolation circuitry, the transmit circuitry path is to protect against signals received through the transmit circuitry path and control signal propagation latency, the isolation circuit is to isolate the transmit circuitry path from voltage received at an output from the transmit circuitry path during transmission mode, the protected controlled latency circuit comprises a buffer and current regulating circuitry coupled in parallel with at least N other sets of a buffer and other current regulating circuitry, an RC time constant of the transmit circuitry path is based on a value of N, and the current regulating circuitry is to reduce a level of received current at the buffer due a voltage applied at the input/output port during the transmission mode.

2. The apparatus of claim 1, wherein the transmit circuitry path is to provide single-digit nanosecond rise time for a transmitted timing signal.

3. The apparatus of claim 1, wherein the receive circuitry path comprises one or more of:

current regulating circuitry connected between the isolation circuit and the second circuitry and second current regulating circuitry connected between the second circuitry and the circuitry to generate the timing signal based on the received signal.

4. The apparatus of claim 1, wherein the primary-secondary clock scheme comprises Institute of Electrical and Electronics Engineers (IEEE) 1588 Precision Time Protocol (PTP).

5. The apparatus of claim 1, comprising a network interface coupled to the receive circuitry path and the transmit circuitry path, the network interface to transmit and receive data packets.

6. The apparatus of claim 1, comprising a rack, server, or data center, wherein the rack, server, or data center include the circuitry to generate the timing signal based on the received signal, the receive circuitry path, and the transmit circuitry path.

7. A method comprising:

performing time synchronization using a circuit that provides protection against circuit damage from misconfigured port use of signal transmission during receive mode and signal receipt during transmit mode and commensurate with providing the protection, the circuit controlling latency of a transmit signal, wherein the circuit comprises:

an input/output port;

a first circuitry to generate a timing signal by calibration of the timing signal and a received signal and based on a primary-secondary clock scheme, wherein the received signal comprises a 1 PPS signal, a 10 MHz signal, or other frequency clock signal;

a receive circuitry path to transfer the received signal to the first circuitry, wherein the receive circuitry path comprises an isolation circuit coupled to the input/output port and second circuitry to receive different voltage level ranges of the received signal;

a transmit circuitry path to transfer the timing signal for transmission from the input/output port, wherein the transmit circuitry path comprises a protected controlled latency circuit coupled to an isolation circuitry, the transmit circuitry path is to protect against signals received through the transmit circuitry path and provide a controlled signal propagation latency and the isolation circuit is to isolate the transmit circuitry path from voltage received at an output from the transmit circuitry path during transmission mode, and a current regulating circuitry is to reduce a level of received current at a buffer based on a voltage applied at the input/output port during the transmission mode.

8. The method of claim 7, wherein the transmit circuitry path comprising:

a set of a buffer in series with a current regulating circuitry coupled in parallel with at least N other sets of a buffer in series with a current regulating circuitry, wherein a number N adjusts an RC time constant of the transmit circuitry path.

9. The method of claim 7, wherein the receive circuitry path comprises:

a current regulating circuitry positioned between the isolation circuit and the second circuitry to receive different voltage level ranges of the received signal; and a second current regulating circuitry between the circuitry to receive different voltage level ranges of the received signal and the circuitry to generate the timing signal based on the received signal.

10. A system comprising:

at least one memory;

at least one processor coupled to the at least one memory; and a network interface comprising a timing synchronization system, wherein the timing synchronization system comprises:

an input/output port;

a transmit circuitry path that is to protect against signals received through the transmit circuitry path and a control signal propagation latency; and a receive circuitry path, wherein:

the timing synchronization system comprises a circuitry to generate a timing signal by calibration of the timing signal and a received signal from the input/output port and based on a primary-secondary clock scheme, wherein the received signal comprises a 1 PPS signal, a 10 MHz signal, or other frequency clock signal, the receive circuitry path to transfer the received signal to the circuitry, wherein the receive circuitry path comprises an isolation circuit coupled to an input/output port and second circuitry to receive different voltage level ranges of the received signal;

the transmit circuitry path to transfer the timing signal for transmission, wherein the transmit circuitry path comprises a protected controlled latency circuit coupled to an isolation circuitry, wherein the transmit circuitry path is to protect against signals received through the transmit circuitry path and provide a controlled signal propagation latency and the isolation circuitry is to isolate the transmit circuitry path from voltage received at an output from the transmit circuitry path during transmission mode.

11. The system of claim 10, wherein the transmit circuitry path comprises:

a set of buffer in series with a resistor coupled in parallel with at least N other sets of buffer in series with a current regulating circuit, wherein a number N effects an RC time constant.

12. The system of claim 11, wherein an RC time constant of the transmit circuitry path is based on a value of N.

13. The system of claim 11, wherein, within the set of buffers, a current regulating circuitry comprises a resistor to reduce current level received at a buffer due a voltage applied at an input/output port during transmission mode.

14. The system of claim 10, wherein the receive circuitry path comprises one or more of current regulating circuitry connected between the isolation circuit and the second circuitry and second current regulating circuitry connected between the second circuitry and the circuitry to generate the timing signal based on the received signal.

* * * * *